(12) United States Patent
Moriyama et al.

(10) Patent No.: US 8,610,167 B2
(45) Date of Patent: Dec. 17, 2013

(54) GROUP III NITRIDE COMPOUND SEMICONDUCTOR LIGHT-EMITTING DEVICE AND METHOD FOR PRODUCING THE SAME

(75) Inventors: Miki Moriyama, Aichi (JP); Koichi Goshonoo, Aichi (JP)

(73) Assignee: Toyoda Gosei Co., Ltd., Nishikasugai-Gun, Aichi-Ken (JP)

( * ) Notice: Subject to any disclaimer, the term of this patent is extended or adjusted under 35 U.S.C. 154(b) by 586 days.

(21) Appl. No.: 12/585,938

(22) Filed: Sep. 29, 2009

(65) Prior Publication Data

US 2010/0078660 A1    Apr. 1, 2010

(30) Foreign Application Priority Data

Sep. 30, 2008    (JP) ................. 2008-254286

(51) Int. Cl.
*H01L 33/02* (2010.01)
(52) U.S. Cl.
USPC .................... 257/101; 257/103; 257/E33.023
(58) Field of Classification Search
USPC .................... 257/101, 103, E33.023
See application file for complete search history.

(56) References Cited

U.S. PATENT DOCUMENTS

| | | | |
|---|---|---|---|
| 6,172,382 B1 | 1/2001 | Nagahama et al. | |
| 6,497,944 B1 | 12/2002 | Oku et al. | |
| 6,670,647 B1 | 12/2003 | Yamasaki et al. | |
| 6,677,619 B1 | 1/2004 | Nagahama et al. | |
| 6,849,864 B2 | 2/2005 | Nagahama et al. | |
| 7,211,822 B2 | 5/2007 | Nagahama et al. | |
| 7,365,369 B2 | 4/2008 | Nakamura et al. | |
| 7,615,804 B2 | 11/2009 | Nagahama et al. | |
| 7,947,995 B2 | 5/2011 | Muraki et al. | |
| 8,076,679 B2 | 12/2011 | Kinoshita et al. | |
| 2006/0202188 A1* | 9/2006 | Ueta et al. | 257/14 |
| 2008/0073657 A1* | 3/2008 | Liang et al. | 257/89 |
| 2008/0149955 A1 | 6/2008 | Nakamura et al. | |
| 2008/0308906 A1* | 12/2008 | Osada et al. | 257/615 |
| 2010/0025657 A1 | 2/2010 | Nagahama et al. | |
| 2011/0180778 A1* | 7/2011 | Lin et al. | 257/13 |

FOREIGN PATENT DOCUMENTS

| | | |
|---|---|---|
| JP | 11-191635 A | 7/1999 |
| JP | 11-191635 A | 7/1999 |
| JP | 11-191639 A | 7/1999 |
| JP | 11-340510 A | 12/1999 |

(Continued)

OTHER PUBLICATIONS

Japanese Office Action dated May 8, 2012 with a partial English translation thereof.

(Continued)

*Primary Examiner* — Colleen Matthews
(74) *Attorney, Agent, or Firm* — McGinn IP Law Group, PLLC (57) ABSTRACT

An n-type layer of a light-emitting device has a structure in which a first n-type layer, a second n-type layer and a third n-type layer are sequentially laminated in this order on a sapphire substrate, and an n-electrode composed of V/Al is formed on the second n-type layer. The first n-type layer and the second n-type layer are n-GaN, and the third n-type layer is n-InGaN. The n-type impurity concentration of the second n-type layer is higher than that of the first n-type layer and the third n-type layer.

8 Claims, 4 Drawing Sheets

(56) References Cited

FOREIGN PATENT DOCUMENTS

| | | |
|---|---|---|
| JP | 2000-332292 A | 11/2000 |
| JP | 2001-144326 A | 5/2001 |
| JP | 2001-244568 A | 9/2001 |
| JP | 2002-33514 A | 1/2002 |
| JP | 2002-094112 A | 3/2002 |
| JP | 2002094112 A | 3/2002 |
| JP | 2004-134815 A | 4/2004 |
| JP | 2005-268581 A | 9/2005 |
| JP | 2007-067454 A | 3/2007 |
| JP | 2007-67454 A | 3/2007 |
| JP | 2008-124254 A | 5/2008 |

OTHER PUBLICATIONS

Japanese Office Action dated Jan. 29, 2013 with a partial English translation thereof.

* cited by examiner

GROUP III NITRIDE COMPOUND SEMICONDUCTOR LIGHT-EMITTING DEVICE AND METHOD FOR PRODUCING THE SAME

BACKGROUND OF THE INVENTION

1. Field of the Invention

The present invention relates to a group III nitride compound semiconductor light-emitting device in which the contact resistance of an n-electrode is reduced, and a method for producing the same.

2. Description of the Related Art

As a structure of a group III nitride compound semiconductor light-emitting device, a structure is widely known in which an n-type layer is exposed by etching a group III nitride compound semiconductor layer and an n-electrode is formed on the exposed n-type layer.

It is shown in Japanese Unexamined Patent Application Publication No. 11-191635 that the contact resistance of an n-type layer can be reduced and the occurrence of cracks in the n-type layer can be suppressed by forming the n-type layer in such a way that it has a two-layered structure comprising, in order from a substrate, a first layer and a second layer, by making the n-type impurity concentration of the second layer higher than that of the first layer, and by forming an n-electrode on the second layer.

In addition, it is shown in Japanese Unexamined Patent Application Publication No. 2000-332292 that the current diffusivity can be improved by forming an n-type layer in such a way that it has a three-layered structure comprising, in order from a substrate, a first layer, a second layer and a third layer, by making the n-type impurity concentration of the second layer, which is a middle layer, higher than that of the other two layers. It is shown that an n-electrode is formed on the first layer or the second layer.

Further, in Japanese Unexamined Patent Application Publication No. 2001-244568, a method for controlling etching depth is shown in which an etching marker layer is made of a group III nitride compound semiconductor containing In, and the etching depth is controlled by detecting the change in the spectrum of plasma light emission of In.

In order to reduce the contact resistance of an n-electrode, it is desirable that the impurity concentration of an n-type layer be high. However, when the impurity concentration is high, deterioration of translucency, surface flatness and crystallinity is likely to occur. Therefore, it is desirable that the thickness of a layer having a high impurity concentration be as small as possible.

In Japanese Unexamined Patent Application Publication No. 11-191635, the above-described background is taken into consideration and an n-type layer is formed in such a way that it has a two-layered structure comprising a first layer and a second layer, in which the n-type impurity concentration of the second layer is higher, and an n-electrode is formed on the second layer. However, with regard to the second layer described in Japanese Unexamined Patent Application Publication No. 2000-332292, it cannot be said that the impurity concentration and the thinness of the second layer are sufficient to reduce the contact resistance.

Further, in a structure described in Japanese Unexamined Patent Application Publication No. 2000-332292, though the thickness of the second layer having a high impurity concentration is reduced, the n-electrode is not always formed on the second layer, and consequently, the structure does not always have low contact resistance. In addition, in the structures shown in embodiments 1 to 3 in Japanese Unexamined Patent Application Publication No. 2000-332292, the thicknesses of the second layers are equal to or less than 1% of the thicknesses of the third layers. In dry etching, which is a common method for exposing n-type layers, it is almost impossible to stop etching in a condition where the second layer is exposed, in view of the fact that an etching rate of an etching device varies (usually ±3 to 10%) over a substrate surface and among substrates.

Because of these problems, there has been a need for a structure in which an n-type layer having a high impurity concentration and that is as thin as possible is provided, and in which etching can be stopped without fail in a condition where the n-type layer is exposed.

SUMMARY OF THE INVENTION

Accordingly, an object of the present invention is to provide a group III nitride compound semiconductor light-emitting device in which the contact resistance of an n-electrode is reduced without deteriorating the translucency and the surface flatness of an n-type layer, and a method for producing the same.

A first aspect of the present invention is a light-emitting device in which an n-type layer composed of a group III nitride compound semiconductor, an active layer and a p-type layer are sequentially laminated on a growth substrate, an n-electrode is formed on the n-type layer exposed by etching and a p-electrode is formed on the p-type layer, in which: the n-type layer has a structure in which a first n-type layer, a second n-type layer and a third n-type layer are laminated sequentially in this order from the side near to the growth substrate; constituent elements of the second n-type layer and the third n-type layer are different; the n-type impurity concentration of the second n-type layer is higher than that of the first n-type layer and the third n-type layer; and the n-electrode is formed on the second n-type layer.

The group III nitride compound semiconductor refers to a substance represented by the general formula $Al_xGa_yIn_{1-x-y}N$ ($0 \leq x \leq 1$, $0 \leq y \leq 1$, $0 \leq x+y \leq 1$), such as GaN, AlGaN, InGaN and AlGaInN. Si or the like is used as an n-type impurity, and Mg or the like is used as a p-type impurity.

As the growth substrate, foreign substrates such as sapphire substrates and SiC substrates, and group III nitride compound semiconductor substrates such as GaN substrates can be used.

As the n-electrode, conventionally used Ti/Al, V/Al, or the like can be used. In addition to that, as a result that the contact resistance can be reduced, materials which have been conventionally difficult to employ because of high contact resistance such as Ag, Al alloy, refractory metals, and nitride compounds, carbide compounds and conductive oxide compounds thereof, can be used as the n-electrode.

Any n-type layer can be employed as long as it has a structure composed of at least three layers of the first to the third n-type layers. The n-type layer may have an n-type cladding layer between the third n-type layer and the active layer.

The growth conditions of the first n-type layer and the third n-type layer, such as the n-type impurity concentrations and the thicknesses thereof, may be same or may be different. In addition, the second n-type layer may have a super-lattice structure.

It is desirable that the n-type impurity concentration of the first n-type layer and the third n-type layer be $1 \times 10^{18}$ to $1 \times 10^{19}/cm^3$ and the n-type impurity concentration of the second n-type layer be $1 \times 10^{19}$ to $1 \times 10^{20}/cm^3$. When the n-type impurity concentrations are in these ranges, the contact resistance of the n-electrode can be sufficiently reduced and the deterioration of the translucency and the surface flatness of the n-type layer does not occur. It is more desirable that the n-type impurity concentration of the first n-type layer and the third n-type layer be $2\times10^{18}$ to $6\times10^{18}/cm^3$ and the n-type impurity concentration of the second n-type layer be $2\times10^{19}$ to $6\times10^{19}/cm^3$. In addition, it is desirable that the thickness of the second n-type layer be equal to or less than 1 μm because the translucency and the surface flatness will deteriorate too much in the case where the thickness exceeds 1 μm.

A second aspect of the present invention is the light-emitting device according to the first aspect of the present invention, in which the third n-type layer may be GaN, and the second n-type layer may be AlGaN, InGaN or AlGaInN.

A third aspect of the present invention is a light-emitting device in which an n-type layer composed of a group III nitride compound semiconductor, an active layer and a p-type layer are sequentially laminated on a growth substrate, an n-electrode is formed on the n-type layer exposed by etching and a p-electrode is formed on the p-type layer, in which: the n-type layer has a structure in which a first n-type layer, a second n-type layer and a third n-type layer are laminated sequentially in this order from the side near to the growth substrate, and an etching marker layer is formed between the second n-type layer and the third n-type layer; constituent elements of the etching marker layer and the third n-type layer are different; the n-type impurity concentration of the second n-type layer is higher than that of the first n-type layer and the third n-type layer; and the n-electrode is formed on the second n-type layer.

A fourth aspect of the present invention is the light-emitting device according to the third aspect of the present invention, in which the third n-type layer may be GaN, and the etching marker layer may be AlGaN, InGaN or AlGaInN.

A fifth aspect of the present invention is the light-emitting device according to any one of the first to the fourth aspects of the present invention, in which the n-type impurity concentration of the first n-type layer and the third n-type layer may be $1\times10^{18}$ to $1\times10^{19}/cm^3$ and the n-type impurity concentration of the second n-type layer may be $1\times10^{19}$ to $1\times10^{20}/cm^3$.

A sixth aspect of the present invention is a method for producing a light-emitting device composed of a first step for sequentially laminating an n-type layer composed of a group III nitride compound semiconductor, an active layer and a p-type layer on a growth substrate, a second step for performing dry etching in such a way that the n-type layer is exposed and a third step for forming an n-electrode on the exposed n-type layer, in which: the first step is for forming the n-type layer by laminating a first n-type layer, a second n-type layer and a third n-type layer sequentially in this order from the side near to the growth substrate, for forming the n-type layer in such a way that constituent elements of the second n-type layer and the third n-type layer are different, and for forming the n-type layer in such a way that the n-type impurity concentration of the second n-type layer is higher than that of the first n-type layer and the third n-type layer; the second step is for exposing the second n-type layer by performing dry etching until the difference between the constituent elements of the second n-type layer and the third n-type layer is detected; and the third step is for forming an n-electrode on the second n-type layer exposed by the second step.

The difference between the constituent elements can be detected in the second step, for example, by the change in the spectrum of plasma light emission. Because of the difference between the constituent elements, precise etching can be performed.

A seventh aspect of the present invention is the method for producing a light-emitting device according to the sixth aspect of the present invention, in which the third n-type layer may be GaN, and the second n-type layer may be AlGaN, InGaN or AlGaInN.

An eighth aspect of the present invention is a method for producing a light-emitting device composed of a first step for sequentially laminating an n-type layer composed of a group III nitride compound semiconductor, an active layer and a p-type layer on a growth substrate, a second step for performing dry etching in such a way that the n-type layer is exposed and a third step for forming an n-electrode on the exposed n-type layer, in which: the first step is for forming the n-type layer by laminating a first n-type layer, a second n-type layer, an etching marker layer and a third n-type layer sequentially in this order from the side near to the growth substrate, for forming the n-type layer in such a way that constituent elements of the etching marker layer and the third n-type layer are different, and for forming the n-type layer in such a way that the n-type impurity concentration of the second n-type layer is higher than that of the first n-type layer and the third n-type layer; the second step is for exposing the etching marker layer by performing dry etching until the difference between the constituent elements of the etching marker layer and the third n-type layer is detected, and for exposing the second n-type layer by subsequently performing additional dry etching to a prescribed depth; the third step is for forming an n-electrode on the second n-type layer exposed by the second step.

A ninth aspect of the present invention is the method for producing a light-emitting device according to the eighth aspect of the present invention, in which the third n-type layer may be GaN, and the etching marker layer may be AlGaN, InGaN or AlGaInN.

A tenth aspect of the present invention is a method for producing a light-emitting device according to any one of the sixth to the ninth aspect of the present invention, in which the n-type impurity concentration of the first n-type layer and the third n-type layer may be $1\times10^{18}$ to $1\times10^{19}/cm^3$ and the n-type impurity concentration of the second n-type layer may be $1\times10^{19}$ to $1\times10^{20}/cm^3$.

DESCRIPTION OF THE PREFERRED EMBODIMENTS

Figure 1:
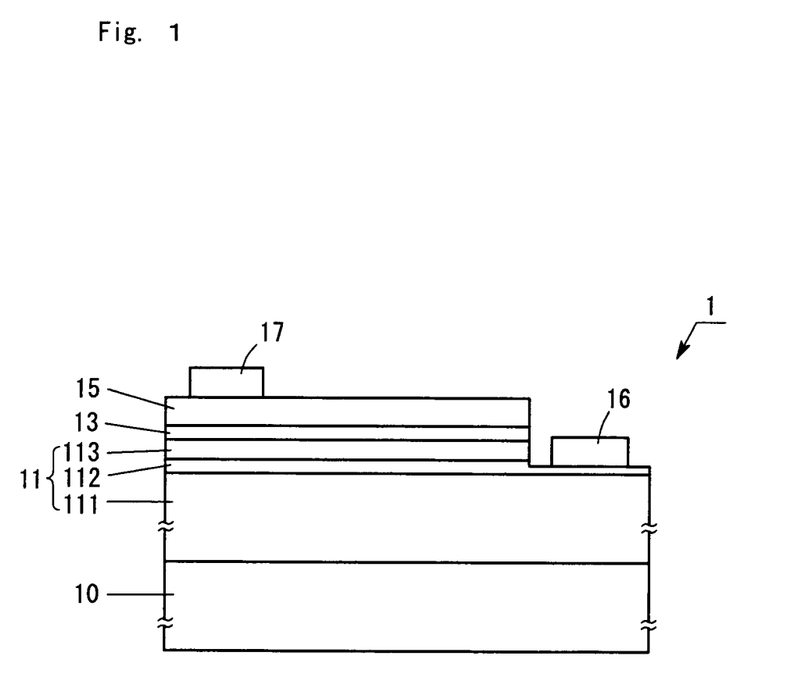
FIG. 1 is a view showing the structure of a light-emitting device 1.

Specific embodiments of the present invention will be described below with reference to drawings. However, the present invention should not be limited to the embodiments.
First Embodiment FIG. 1 is a view showing the structure of a light-emitting device 1 comprising a group III nitride compound semiconductor. The light-emitting device 1 has the following structure: a buffer layer (not shown) is formed on a sapphire substrate 10, a growth substrate; a first n-type layer 111, a second n-type layer 112 and a third n-type layer 113, which constitute an n-type layer 11, are laminated on the buffer layer; an active layer 13 and a p-type layer 15 are sequentially laminated on the n-type layer 11; an n-electrode 16 composed of V/Al is formed on the second n-type layer 112 exposed by etching a partial region of the layers described above; and a p-electrode 17 is formed on the p-type layer 15.

The first n-type layer 111 and the second n-type layer 112 are n-GaN, and the third n-type layer 113 is n-$In_{0.04}Ga_{0.96}N$. As just described, the third n-type layer 113 contains In, which is not contained in the second n-type layer 112, as a constituent element. An n-type impurity is Si, the n-type impurity concentration of the first n-type layer 111 and the third n-type layer 113 is $2\times10^{18}/cm^3$, and the n-type impurity concentration of the second n-type layer 112 is $2\times10^{19}/cm^3$. The thicknesses of the first n-type layer 111, the second n-type layer 112 and the third n-type layer 113 are 3 μm, 50 nm and 75 nm, respectively.

The n-type impurity concentrations and the thicknesses of the first n-type layer 111, the second n-type layer 112 and the third n-type layer 113 are not limited to the above-described values. However, it is desirable that the n-type impurity concentration of the first n-type layer 111 and the third n-type layer 113 be $1\times10^{18}$ to $1\times10^{19}/cm^3$ and the n-type impurity concentration of the second n-type layer be $1\times10^{19}$ to $1\times10^{20}/cm^3$. When the n-type impurity concentrations are in these ranges, the contact resistance of the n-electrode 16 can be sufficiently reduced and deterioration of the translucency and the surface flatness of the n-type layer 11 does not occur. Further, it is desirable that the thickness of the first n-type layer 111 be 1 to 10 μm. It is not desirable that the thickness be less than 1 μm because the sheet resistance of the n-type layer 11 will be high, and it is not desirable that the thickness exceed 10 μm because warpage of a wafer will occur.

One reason for providing the first n-type layer 111 is that the crystallinity will be deteriorated when the second n-type layer 112 having a high n-type impurity concentration is formed directly on the sapphire substrate 10. Another reason is that the sheet resistance of the n-type layer 11 will be high when the first n-type layer 111 is not provided.

The active layer 13 comprises, for example, an MQW structure in which InGaN and GaN are laminated repeatedly, and has a thickness of 50 nm.

The p-type layer 15 is a layer comprising p-GaN, and has a thickness of 100 nm.

For the p-electrode 17, Ni/Au or the like is used. The p-electrode 17 may be constituted by a transparent electrode such as ITO formed over the entire top surface of the p-type layer 15 and a pad electrode formed on the transparent electrode. Further, in the case of a flip-tip type, metals with high optical reflectance and low contact resistance, such as Ag, may be used.

The reason for setting the thicknesses of the second n-type layer 112 and the third n-type layer 113 to the values described above, and the reason for providing the first n-type layer 111 and the third n-type layer 113 are hereinafter described.

In order to reduce the contact resistance of the n-electrode 16, it is necessary to stop etching in a condition where the second n-type layer 112 having a high n-type impurity concentration is surely exposed. However, when using ordinary dry etching devices, the etching depth varies over a substrate surface, and among substrates. In each case, such variations are equal to or less than ±10%. After considering such variations, in the case where a target etching depth is set at "a", the actual etching depth could be in the range of 0.81a to 1.21a. Consequently, when complete etching to the depth "a" is attempted, the etching is performed with a target depth 100a/81 (≈1.23a), and the actual etching depth will be up to 121a/81 (≈1.5a). When there is a structure without the third n-type layer 113, and the depth from the surface of the p-type layer 15 to the surface of the second n-type layer 112 is set at "a", the minimum thickness of the second n-type layer 112, which makes it possible to perform etching in such a way that the second n-type layer 112 is completely exposed and that the first n-type layer 111 is not exposed, is 0.5a.

When using the method for controlling etching depth by detecting the spectrum of plasma light emission described in Japanese Unexamined Patent Application Publication No. 2001-244568 here, there is no need to consider the variations among substrates and consideration is required only for variations over a substrate surface, and thereby the thickness of the second n-type layer 112 can be further reduced. However, a multilayer thin film such as the active layer 13 is formed on the second n-type layer 112, and plasma light emission is unstable during the etching of the multilayer thin film. Therefore, it is difficult to detect that the etching has reached the second n-type layer 112.

Therefore, the third n-type layer 113 whose constituent elements are different from those of the second n-type layer 112 is provided in the light-emitting device 1 in the first embodiment. When the thickness of the third n-type layer 113 is set at 0.5a, it is possible to perform etching until the third n-type layer 113 is completely exposed, and when etching is performed subsequently until the second n-type layer 112 is exposed while controlling the etching depth by detecting the spectrum of plasma light emission, it is possible to easily detect, from the difference between the constituent elements of the second n-type layer 112 and of the third n-type layer 113, that the etching has reached the second n-type layer 112. Further, in the case where variations over a substrate surface only are considered with regard to the depth from the surface of the p-type layer 15 to the surface of the third n-type layer 113, which is 1.5a, and when etching is performed with a target depth of (10/9)*1.5a≈1.67a, the actual etching depth will be up to (11/9)*1.5a≈1.83a. Therefore, when the third n-type layer 113 is provided, the minimum thickness of the second n-type layer 112, which makes it possible to perform etching in such a way that the second n-type layer 112 is completely exposed and that the first n-type layer 111 is not exposed, is a/3≈0.33a.

In the light-emitting device 1, the thickness from the surface of the p-type layer 15 to the surface of the third n-type layer 113 is 150 nm. Consequently, the thickness of the second n-type layer 112 can be maximally reduced when the thickness of the third n-type layer 113 is arranged to be 150*0.5=75 nm and the thickness of the second n-type layer 112 is arranged to be 150*0.33≈50 nm.

As just described, by providing the third n-type layer 113, the thickness of the second n-type layer 112 can be reduced in comparison to the structure in which the third n-type layer 113 is not provided, and as a result, translucency can be improved. Further, though crystallinity and surface flatness is deteriorated by providing the second n-type layer 112 having a high n-type impurity concentration, by providing the third n-type layer 113 having a low n-type impurity concentration, the crystallinity and the surface flatness can be restored and the properties of the active layer 13 provided on the third n-type layer 113 can be improved.

Though the performance of a dry etching device is considered with the proviso that each of etching depth variations over a substrate surface and among substrates is equal to or less than ±10%, even in the case of a dry etching device with a different performance (for example, each of etching depth variations over a substrate surface and among substrates is equal to or less than ±5%, etc.), the thickness of the second n-type layer 112 and the third n-type layer 113 can be determined through the same consideration in accordance with the performance of the dry etching device.

In addition, the thickness of the second n-type layer 112 can be further reduced by using the difference in etching rates caused by the difference in composition.

As described above, according to the structure of the light-emitting device 1, only the second n-type layer 112, which is a partial region of the n-type layer 11, has a high n-type impurity concentration, and the translucency and the surface flatness of the n-type layer 11 is not deteriorated because the second n-type layer 112 is sufficiently thin. In addition, as etching is performed in such a way that the second n-type layer 112 is exposed without fail, and the n-electrode 16 is provided on the second n-type layer 112 having a high n-type impurity concentration, the contact resistance is reduced.

Next, the production process of the light-emitting device 1 is described with reference to FIG. 2.

Figure 2A:
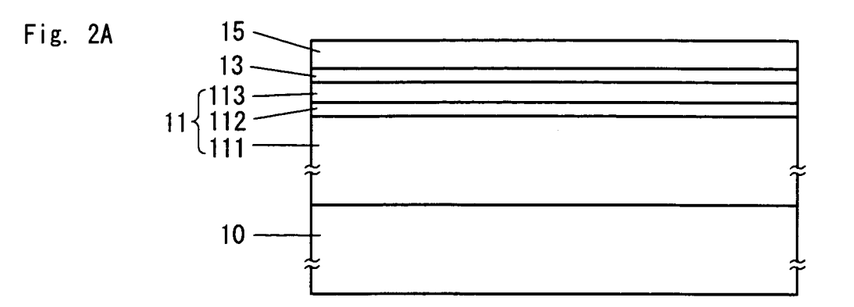
FIG. 2 is a view showing the production process of the light-emitting device 1.

First, a buffer layer is formed on the sapphire substrate 10 by an MOCVD method, and on the buffer layer, the first n-type layer 111, the second n-type layer 112, the third n-type layer 113, the active layer 13 and the p-type layer 15 are sequentially laminated (FIG. 2A). In the MOCVD method, the following material gasses are used: TMG (trimethylgallium) as a Ga source, TMA (trimethylaluminium) as an Al source, TMI (trimethylindium) as an In source, ammonia as an N source, silane as an Si source, and $Cp_2Mg$ (biscyclopentadienylmagnesium) as an Mg source, which is a p-type impurity. As a carrier gas, nitrogen is used. When forming the third n-type layer 113, it is preferable that growth conditions be adjusted such that the surface flatness and the crystallinity are improved as much as possible.

Figure 2B:
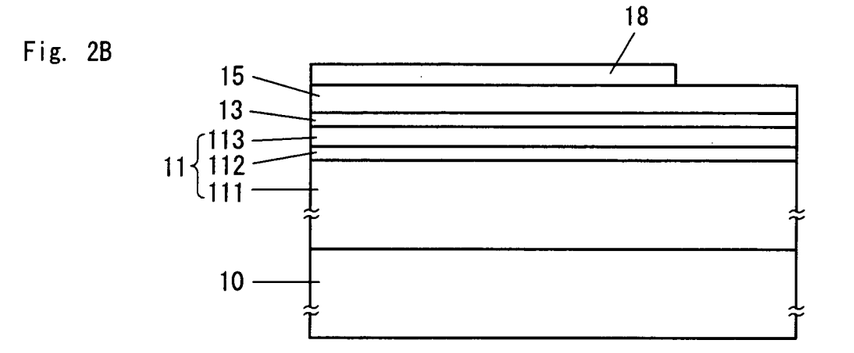

Next, a mask 18 is formed on the p-type layer 15 by a CVD method and the mask 18 is patterned by photolithography to form a prescribed shape (FIG. 2B). A resist can be used as a mask.

Figure 2C:
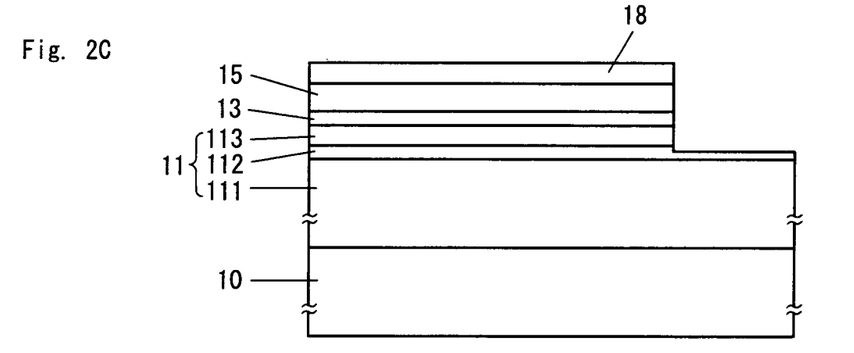

Next, dry etching is performed on a region where the mask 18 is not formed to the depth at which the second n-type layer 112 is exposed (FIG. 2C). As the third n-type layer 113 contains In, which is not contained in the second n-type layer 112, as a constituent element, by detecting the presence of In, the etching can be performed precisely to the depth at which the second n-type layer 112 is exposed. It is possible to detect In, for example, by the change in the spectrum of plasma light emission. When the third n-type layer 113 is being etched, a peak of light emission spectrum corresponding, to In appears, and when the etching depth reaches the second n-type layer 112, the peak of light emission spectrum corresponding to In disappears. Whether the etching has reached the second n-type layer 112 can be judged in accordance with the presence/absence of the peak. In the case where etching rate is different between GaN and InGaN, the change in etching rate leads to a change in the intensity of light emission corresponding to Ga or N, and therefore, whether the etching has reached the second n-type layer 112 may be judged by using the change.

Next, by a vapor deposition method, a p-electrode 17 is formed on the p-type layer 15, and an n-electrode 16 is formed on the second n-type layer 112 exposed by the etching. The light-emitting device 1 shown in FIG. 1 has been thus produced.

Next, results obtained by comparison of emission output and driving voltage of the light-emitting device 1 and light-emitting devices in Comparative Examples 1 and 2 are described. In the light-emitting device in Comparative Example 1, an n-type layer with a thickness of 3 μm which comprises n-GaN having an n-type impurity concentration of $2 \times 10^{18}/cm^3$ is formed instead of the n-type layer 11 having a three-layered structure in the light-emitting device 1. In the light-emitting device in Comparative Example 2, an n-type layer with a thickness of 3 μm which comprises n-GaN having an n-type impurity concentration of $2 \times 10^{19}/cm^3$ is formed instead of the n-type layer 11 in the light-emitting device 1.

As to the light-emitting device in Comparative Example 2, the driving voltage at 20 mA was lower than that of the light-emitting device 1 and the light-emitting device in Comparative Example 1. However, the emission output of the light-emitting device in Comparative Example 2 was significantly lower than that of the light-emitting device 1 and the light-emitting device in Comparative Example 1.

In addition, when comparing the light-emitting device 1 and the light-emitting device in Comparative Example 1, the driving voltage at 20 mA of the light-emitting device 1 was 0.02 V lower than that of the light-emitting device in Comparative Example 1. Further, as for the increase in the driving voltage observed when the amperage was increased, the light-emitting device 1 exhibited lower increase than the light-emitting device in Comparative Example 1. The emission outputs of the light-emitting device 1 and the light-emitting device in Comparative Example 1 were nearly equal, and the difference was within the margin of measurement error.

As just described, it can be seen that though the contact resistance of the n-electrode 15 is reduced, the translucency and the like of the n-type layer is not deteriorated in the light-emitting device 1.

Second Embodiment

Figure 3:
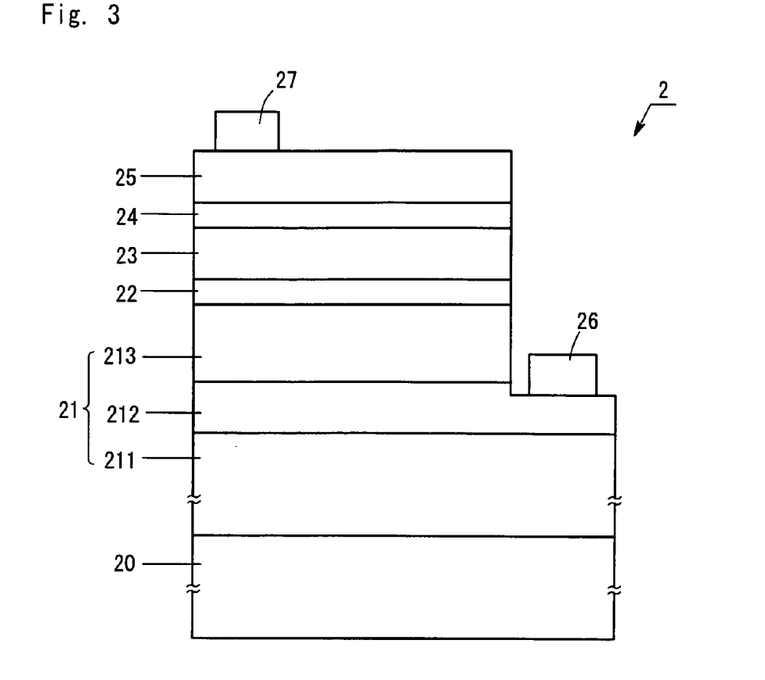
FIG. 3 is a view showing the structure of a light-emitting device 2.

FIG. 3 is a view showing the structure of the light-emitting device 2 in the second embodiment. The light-emitting device 2 has the following structure: a buffer layer (not shown) is formed on a sapphire substrate 20, a growth substrate; a first n-type layer 211, a second n-type layer 212 and a third n-type layer 213, which constitute an n-type layer 21, are laminated on the buffer layer; an n-type cladding layer 22, an active layer 23, a p-type cladding layer 24 and a p-type layer 25 are sequentially laminated on the n-type layer 21; an n-electrode 26 composed of W/Au is formed on the second n-type layer 212 exposed by etching a partial region of the layers described above; and a p-electrode 27 is formed on the p-type layer 25. Heat treatment after the formation of the n-electrode 26 was conducted at a temperature 200° C. lower than the temperature of heat treatment after the formation of the n-electrode 16.

The first n-type layer 211 and the third n-type layer 213 are n-GaN, and the second n-type layer 212 is n-$In_{0.04}Ga_{0.96}N$. As just described, the second n-type layer 212 contains In, which is not contained in the third n-type layer 213, as a constituent element. An n-type impurity is Si, and the n-type impurity concentration of the first n-type layer 211 and the third n-type layer 213 is $6 \times 10^{18}/cm^3$, and the n-type impurity concentration of the second n-type layer 212 is $5 \times 10^{19}/cm^3$. In addition, the thicknesses of the first n-type layer 211, the second n-type layer 212 and the third n-type layer 213 are 4 μm, 200 nm and 300 nm, respectively.

The n-type cladding layer 22 and the p-type cladding layer 24 have super-lattice structures. For example, the n-type cladding layer 22 is a layer in which InGaN/GaN/n-GaN is laminated a plurality of times repeatedly, and the p-type cladding layer 24 is a layer in which p-InGaN/p-AlGaN is laminated a plurality of times repeatedly.

The thickness from the surface of the p-type layer 25 to the surface of the third n-type layer 213 is 600 nm. Provided that each of etching depth variations over a substrate surface and among substrates is equal to or less than ±10%, according to the consideration in the first embodiment, the minimum thickness of the second n-type layer 212, which makes it possible to expose the second n-type layer 212 without fail, can be obtained in the case where the thickness of the second n-type layer 212 is 200 nm and the thickness of the third n-type layer 213 is 300 nm. In fact, the second n-type layer 212 in the light-emitting device 2 is formed such that it has this thickness.

Contrary to the light-emitting device 1 in the first embodiment, the second n-type layer 212 of the light-emitting device 2 contains In, which is not contained in the third n-type layer 213, as a constituent element. Therefore, when a peak of light emission spectrum corresponding to In is detected during etching for exposing the second n-type layer 212, it can be judged that the etching depth has reached the second n-type layer 212, and thereby the etching can be performed precisely until the second n-type layer 212 is exposed.

Next, the results obtained by the comparison of driving voltage of the light-emitting device 2 and light-emitting devices in Comparative Examples 1 and 3 are described. In the light-emitting device in Comparative Example 3, an n-type layer with a thickness of 3 μm which comprises n-GaN having an n-type impurity concentration of $2 \times 10^{18}/cm^3$ is formed instead of the n-type layer 21 having a three-layered structure in light-emitting device 2.

The driving voltage at 20 mA of the light-emitting device in Comparative Example 3 was 0.3 V higher than that of the light-emitting device in Comparative Example 1. However, the driving voltage at 20 mA of the light-emitting device 2 was slightly higher, by only 0.03 V, than that of the light-emitting device in Comparative Example 1, that is, the driving voltages of the two light-emitting devices were nearly equal.

As just described, just like the light-emitting device 1, the light-emitting device 2 has a structure in which the contact resistance of the n-electrode can be reduced without deteriorating the translucency and the like of the n-type layer 11, and therefore, even if W/Au, which have been conventionally difficult to employ because of high contact resistance, is employed as the n-electrode, the same element property can be obtained as in the case of the light-emitting device in Comparative Example 1, which has a conventional structure in which V/Al is employed as the n-electrode.

Third Embodiment

Figure 4:
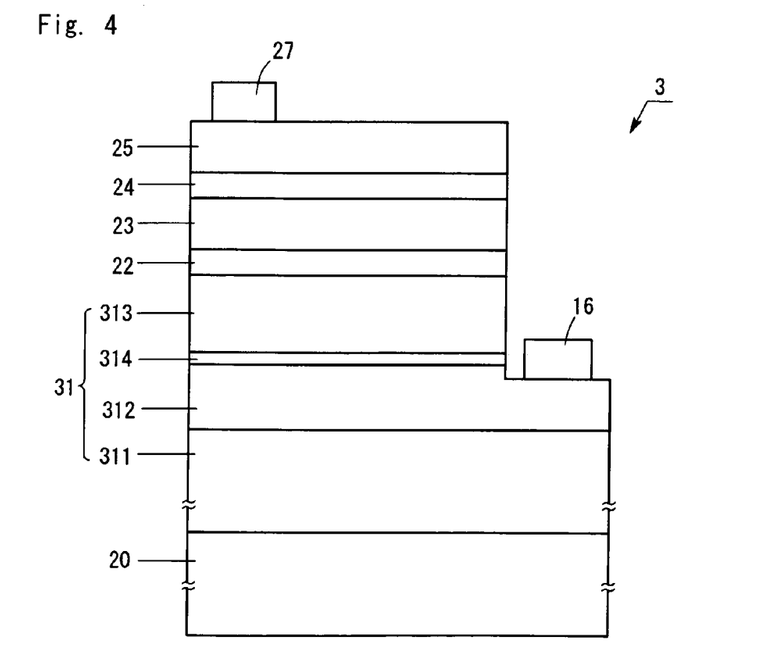
FIG. 4 is a view showing the structure of a light-emitting device 3.

FIG. 4 is a view showing the structure of the light-emitting device 3 in the third embodiment. The light-emitting device 3 is different from the light-emitting device 2 in that an n-type layer 31 described below is provided instead of the n-type layer 21 and that an n-electrode 16 is provided, as in the light-emitting device 1, instead of the n-electrode 26. Except these differences, the structure of the light-emitting device 3 is the same as that of the light-emitting device 2.

The n-type layer 31 has a structure in which a first n-type layer 311, a second n-type layer 312, an etching marker layer 314 and a third n-type layer 313 are sequentially laminated in this order from the side of a sapphire substrate 20. The n-electrode 16 is provided on the second n-type layer 312 in a same manner as in the first embodiment. Each of the first n-type layer 311, the second n-type layer 312 and the third n-type layer 313 is n-GaN, and the etching marker layer 314 is n-$In_{0.1}Ga_{0.9}N$. The n-type impurity concentration of the first n-type layer 311, the third n-type layer 313 and the etching marker layer 314 is $5 \times 10^{18}/cm^3$, and the n-type impurity concentration of the second n-type layer 312 is $3 \times 10^{19}/cm^3$. The thicknesses of the first n-type layer 311, the second n-type layer 312, the etching marker layer 314 and the third n-type layer 313 are 4 μm, 250 nm, 50 nm and 300 nm, respectively.

Next, the production process of the light-emitting device 3 is described with reference to FIG. 5.

Figure 5A:
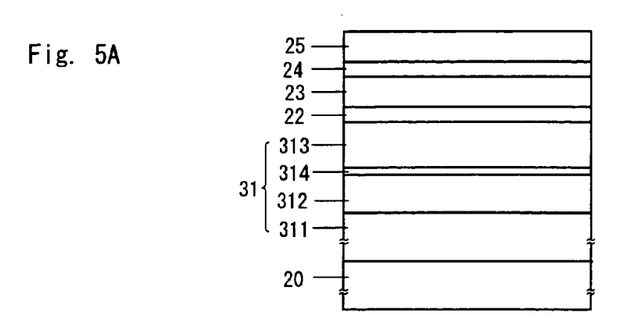
FIG. 5 is a view showing the production process of the light-emitting device 3.

First, a buffer layer is formed on the sapphire substrate 20 by MOCVD method, and on the buffer layer, the first n-type layer 311, the second n-type layer 312, the etching marker layer 314, the third n-type layer 313, an n-cladding layer 22, an active layer 23, a p-cladding layer 24 and a p-type layer 25 are sequentially laminated (FIG. 5A).

Figure 5B:
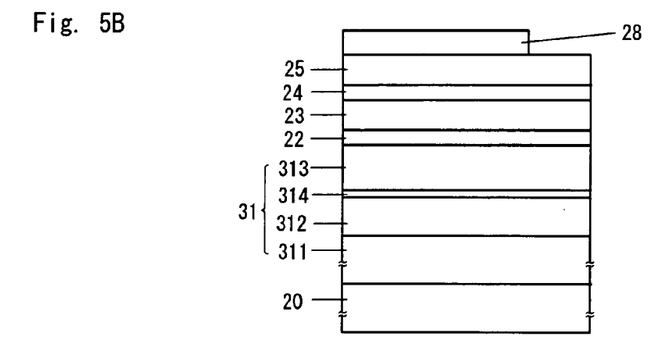

Next, a mask 28 is formed on the p-type layer 25 by CVD method and the mask 28 is patterned by photolithography to form a prescribed shape (FIG. 5B).

Figure 5C:
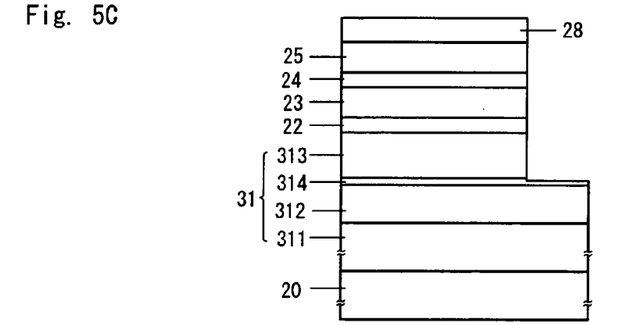

Next, dry etching is performed on a region where the mask 28 is not formed to the depth at which the etching marker layer 314 is exposed (FIG. 5C). As the etching marker layer 314 contains In, which is not contained in the third n-type layer 313, as a constituent element, by detecting In, the etching can be performed precisely to the depth at which the etching marker layer 314 is exposed.

Figure 5D:
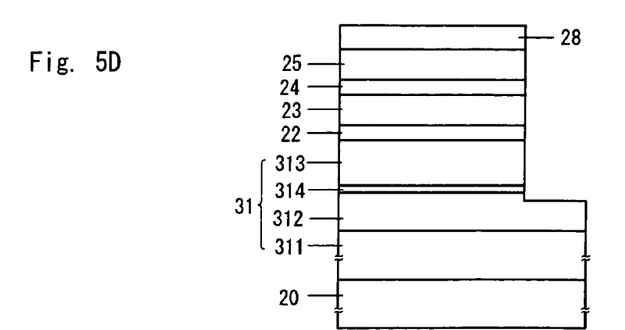

Next, after the etching marker layer 314 is exposed, dry etching is further performed to expose the second n-type layer 312 (FIG. 5D). As the etching depth for exposing the second n-type layer 312 is small, an error in the depth becomes small accordingly, and thereby the etching can be precisely performed based on etching rate to the depth at which the second n-type layer 312 lies.

Next, by a vapor deposition method, a p-electrode 27 is formed on the p-type layer 25, and the n-electrode 16 is formed on the second n-type layer 312 exposed by the etching. The light-emitting device 3 shown in FIG. 4 has been thus produced.

The light-emitting device 3, just like the light-emitting device 2 in the second embodiment, has a structure in which only the second n-type layer 312, which is a partial region of the n-type layer 31, has a high n-type impurity concentration, the second n-type layer 312 is sufficiently thin, and the n-type electrode 16 is provided on the second n-type layer 312 having a high n-type impurity concentration. Therefore, the contact resistance of the n-electrode 16 is reduced without deteriorating the translucency and the surface flatness of the n-type layer 31 in the light-emitting device 3.

The third n-type layer is InGaN in the first embodiment, the second n-type layer is InGaN in the second embodiment and the etching marker layer is InGaN in the third embodiment, and etching depth is controlled by detecting In. However, it does not have to be In as long as constituent elements of the second n-type layer or the etching marker layer and the third n-type layer are different. For example, the second n-type layer, the third n-type layer and the etching marker layer may be AlGaN or AlGaInN, and the etching depth may be controlled by detecting the presence of Al or both Al and In.

In addition, as the structure according to the present invention makes it possible to reduce the contact resistance of an n-electrode, materials which have been conventionally difficult to employ such as W/Au in the second embodiment can be employed as the n-electrode. For example, Ag, Al alloy, refractory metals, and nitride compounds, carbide compounds and conductive oxide compounds thereof, can be employed as the n-electrode.

Further, though a sapphire substrate is used as a growth substrate in each embodiment, foreign substrates other than sapphire substrates, or group III nitride compound semiconductor substrates such as GaN substrates may be used.

Industrial Applicability

The light-emitting device according to the present invention can be used for display devices, lighting equipment and the like.

What is claimed is:

1. A light-emitting device, comprising:
an n-type layer comprising a group III nitride compound semiconductor, an active layer and a p-type layer sequentially laminated on a growth substrate, an n-electrode formed on the n-type layer exposed by etching, and a p-electrode formed on the p-type layer,
wherein the n-type layer comprises a structure in which a first n-type layer, a second n-type layer, and a third n-type layer are laminated sequentially in this order from a side near to the growth substrate,
wherein an etching marker layer is formed between the second n-type layer and the third n-type layer, and is contacted with the second n-type layer and the third n-type layer,
wherein an n-type cladding layer is formed on, and is contacted with, the third n-type layer,
wherein the active layer is formed on the n-type cladding layer,
wherein a p-type cladding is formed on the active layer,
wherein the p-type layer is formed on the p-type cladding layer,
wherein at least one of constituent elements of the etching marker layer is different from constituent elements of the third n-type layer are different,
wherein an n-type impurity concentration of the second n-type layer is higher than that of the first n-type layer and the third n-type layer,
wherein the n-electrode is formed on an exposed portion of the second n-type layer, the exposed portion being formed by etching layers from the p-type layer to the etching marker layer,
wherein the third n-type layer comprises GaN, and the etching marker layer comprises at least one of AlGaN, InGaN, and AlGaInN, and
wherein the n-type impurity concentration of the first n-type layer and the third n-type layer is $1\times10^{18}$ to $1\times10^{19}/cm^3$ and the n-type impurity concentration of the second n-type layer is $1\times10^{19}$ to $1\times10^{20}/cm^3$.

2. The light-emitting device according to claim 1, wherein the n-electrode is disposed on a surface of the second n-type layer.

3. The light-emitting device according to claim 1, wherein the n-electrode is disposed on an exposed surface of the second n-type layer.

4. The light-emitting device according to claim 1, wherein the etching marker layer is disposed on an upper surface of the second n-type layer.

5. The light-emitting device according to claim 4, wherein the third n-type layer is disposed on an upper surface of the etching marker layer.

6. The light-emitting device according to claim 1, wherein the second n-type layer, the etching marker layer, the third n-type layer, and the n-cladding layer are stacked in this order in a direction from the substrate to the active layer.

7. The light-emitting device according to claim 1, wherein the etching marker layer abuts the second n-type layer and the third n-type layer, and the third n-type layer. abuts the n-cladding layer.

8. The light-emitting device according to claim 1, wherein the second n-type layer is exposed in a void area that extends from an upper surface of the second n-type layer to the etching marker layer and further extends to the p-type layer.

* * * * *